United States Patent
Chen et al.

(10) Patent No.: US 9,412,725 B2
(45) Date of Patent: Aug. 9, 2016

(54) METHOD AND APPARATUS FOR IMAGE SENSOR PACKAGING

(75) Inventors: Szu-Ying Chen, Toufen Township (TW); Ping-Yin Liu, Yonghe (TW); Calvin Yi-Ping Chao, Zhubei (TW); Tzu-Jui Wang, Fengshan (TW); Jen-Cheng Liu, Hsin-Chu (TW); Dun-Nian Yaung, Taipei (TW); Lan-Lin Chao, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 417 days.

(21) Appl. No.: 13/457,637

(22) Filed: Apr. 27, 2012

(65) Prior Publication Data

US 2013/0284885 A1  Oct. 31, 2013

(51) Int. Cl.
*H01L 27/00* (2006.01)
*H01L 25/16* (2006.01)
*H01L 27/146* (2006.01)

(52) U.S. Cl.
CPC .......... *H01L 25/16* (2013.01); *H01L 27/14618* (2013.01); *H01L 27/14683* (2013.01); *H01L 27/1464* (2013.01); *H01L 2924/0002* (2013.01)

(58) Field of Classification Search
CPC .... H01L 25/16; H01L 25/162; H01L 27/1464
USPC ................. 250/208.1; 257/431–434
See application file for complete search history.

(56) References Cited

U.S. PATENT DOCUMENTS

| 7,276,683 | B2 * | 10/2007 | Mori et al. | 250/208.1 |
| 7,714,403 | B2 * | 5/2010 | Lee et al. | 257/432 |
| 2003/0157748 | A1 * | 8/2003 | Kim et al. | 438/107 |
| 2007/0117338 | A1 * | 5/2007 | Yamamoto et al. | 438/396 |
| 2008/0173904 | A1 * | 7/2008 | Liu et al. | 257/233 |

(Continued)

FOREIGN PATENT DOCUMENTS

| CN | 101859761 A | 10/2010 |
| JP | 2000-150846 A | 5/2000 |

(Continued)

*Primary Examiner* — Thanh Luu
(74) *Attorney, Agent, or Firm* — Slater Matsil, LLP (57) ABSTRACT

Methods and apparatus for packaging a backside illuminated (BSI) image sensor or a sensor device with an application specific integrated circuit (ASIC) are disclosed. According to an embodiment, a sensor device may be bonded together face-to-face with an ASIC without using a carrier wafer, where corresponding bond pads of the sensor are aligned with bond pads of the ASIC and bonded together, in a one-to-one fashion. A column of pixels of the sensor may share a bond bad connected by a shared inter-metal line. The bond pads may be of different sizes and configured in different rows to be disjoint from each other. Additional dummy pads may be added to increase the bonding between the sensor and the ASIC.

23 Claims, 7 Drawing Sheets

(56) References Cited

U.S. PATENT DOCUMENTS

| | | |
|---|---|---|
| 2009/0078973 A1 | 3/2009 | Hsu et al. |
| 2009/0286346 A1 | 11/2009 | Adkisson et al. |
| 2010/0248412 A1 | 9/2010 | Guidash |
| 2010/0258890 A1 | 10/2010 | Ahn |
| 2011/0049336 A1 | 3/2011 | Matsunuma |
| 2011/0102657 A1 | 5/2011 | Takahashi et al. |
| 2012/0001642 A1* | 1/2012 | Sylvester et al. ............. 324/538 |
| 2012/0056251 A1 | 3/2012 | Kudoh |
| 2012/0057056 A1 | 3/2012 | Oike |
| 2013/0068929 A1* | 3/2013 | Solhusvik et al. ......... 250/208.1 |
| 2013/0092822 A1* | 4/2013 | Ichikawa .......... H01L 27/14645 250/208.1 |
| 2013/0334638 A1 | 12/2013 | Chen et al. |

FOREIGN PATENT DOCUMENTS

| | | |
|---|---|---|
| JP | 2006287640 A | 10/2006 |
| JP | 2007173861 A | 7/2007 |
| JP | 2012054495 | 3/2012 |
| JP | 2012054876 | 3/2012 |
| KR | 2011/0014986 A | 2/2011 |

* cited by examiner

METHOD AND APPARATUS FOR IMAGE SENSOR PACKAGING

BACKGROUND

Complementary metal-oxide semiconductor (CMOS) image sensors are gaining in popularity over traditional charged-coupled devices (CCDs). A CMOS image sensor typically comprises an array of picture elements (pixels), which utilizes light-sensitive CMOS circuitry to convert photons into electrons. The light-sensitive CMOS circuitry typically comprises a photodiode formed in a silicon substrate. As the photodiode is exposed to light, an electrical charge is induced in the photodiode. Each pixel may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC).

A CMOS image sensor, or simply a CMOS sensor, may have a front side where a plurality of dielectric layers and interconnect layers are located connecting the photodiode in the substrate to peripheral circuitry, and a backside having the substrate. A CMOS sensor is a front-side illuminated (FSI) image sensor if the light is from the front side of the sensor, otherwise it is a back-side illuminated (BSI) sensor with light incident on the backside. For a BSI sensor, light can hit the photodiode through a direct path without the obstructions from the dielectric layers and interconnect layers located at the front side, which helps to increase the number of photons converted into electrons, and makes the CMOS sensor more sensitive to the light source.

Three-dimensional (3D) integrated circuits (ICs) may be used to achieve a high density required for current applications, such as image sensor applications. When a CMOS sensor is packaged in a 3D IC, a CMOS sensor and its related ASIC may be bonded to a carrier wafer in parallel, which may take a larger area for the carrier wafer. Therefore there is a need for methods and systems to reduce the package area for CMOS sensors bonded to related ASICs.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure discloses methods and apparatus for packaging a CMOS backside illuminated (BSI) image sensor or a sensor device with an application specific integrated circuit (ASIC). According to the embodiments, a sensor device may be bonded together face-to-face with an ASIC without using a carrier wafer, where corresponding bond pads of the sensor are aligned with bond pads of the ASIC and bonded together, in a one-to-one fashion. A column of pixels of the sensor may share a bond bad connected by a shared inter-metal line. The bond pads may be of different sizes and configured in different rows to be disjoint from each other. Additional dummy pads may be added to increase the bonding strength between the sensor and the ASIC.

Figure 1A:
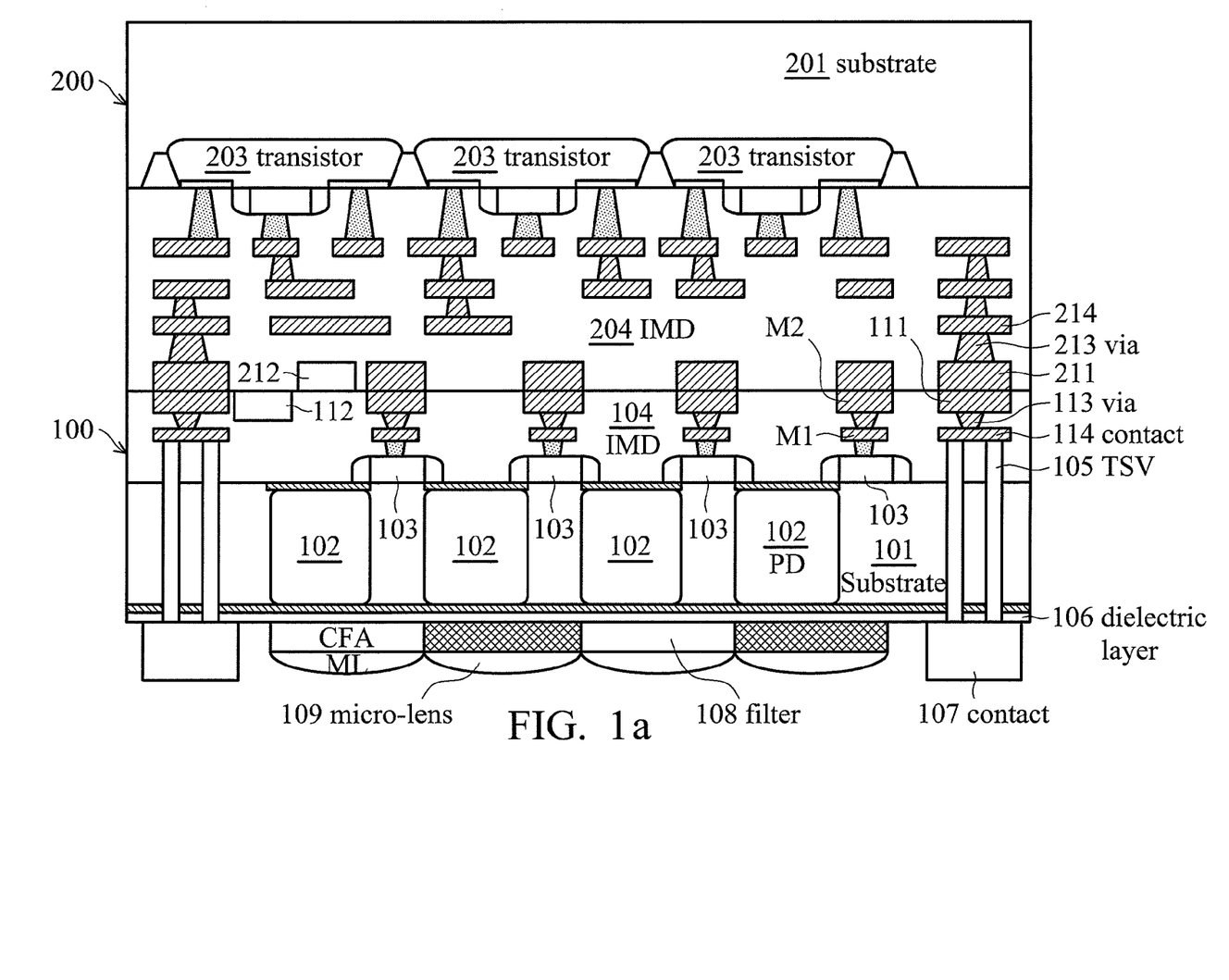
FIGS. 1(a)-1(c) illustrate various views of a CMOS sensor containing columns of pixels directly bonded face-to-face with an ASIC, without using a carrier wafer.

FIG. 1(a) illustrates a cross-section view of a CMOS sensor 100 bonded together face-to-face with an ASIC 200, where corresponding bond pads 111 of the sensor 100 are aligned with bond pads 211 of the ASIC 200 and bonded together, in a one-to-one fashion. The sensor 100 and the ASIC 200 may be bonded together using adhesive bonding, direct copper bonding and direct oxide bonding, or any other method. In the commonly used direct copper bonding, the sensor 100 and the ASIC 200 have bond pads 111 and 211 exposed on the surfaces of the chip, and the two are bonded by applying a high pressure, so that the bond pads 111 and 211, which may be copper pads, are bonded together.

The sensor 100 may be made up of millions of components such as active devices and passive devices. As illustrated in FIG. 1(a), the sensor 100 comprises a substrate 101. The substrate 101 may be a semiconductor material such as silicon, germanium, diamond, or the like. The substrate 101 may be doped with a p-type dopant, such as boron, aluminum, gallium, or the like, although the substrate may alternatively be doped with an n-type dopant, as is known in the art.

Figure 1B:
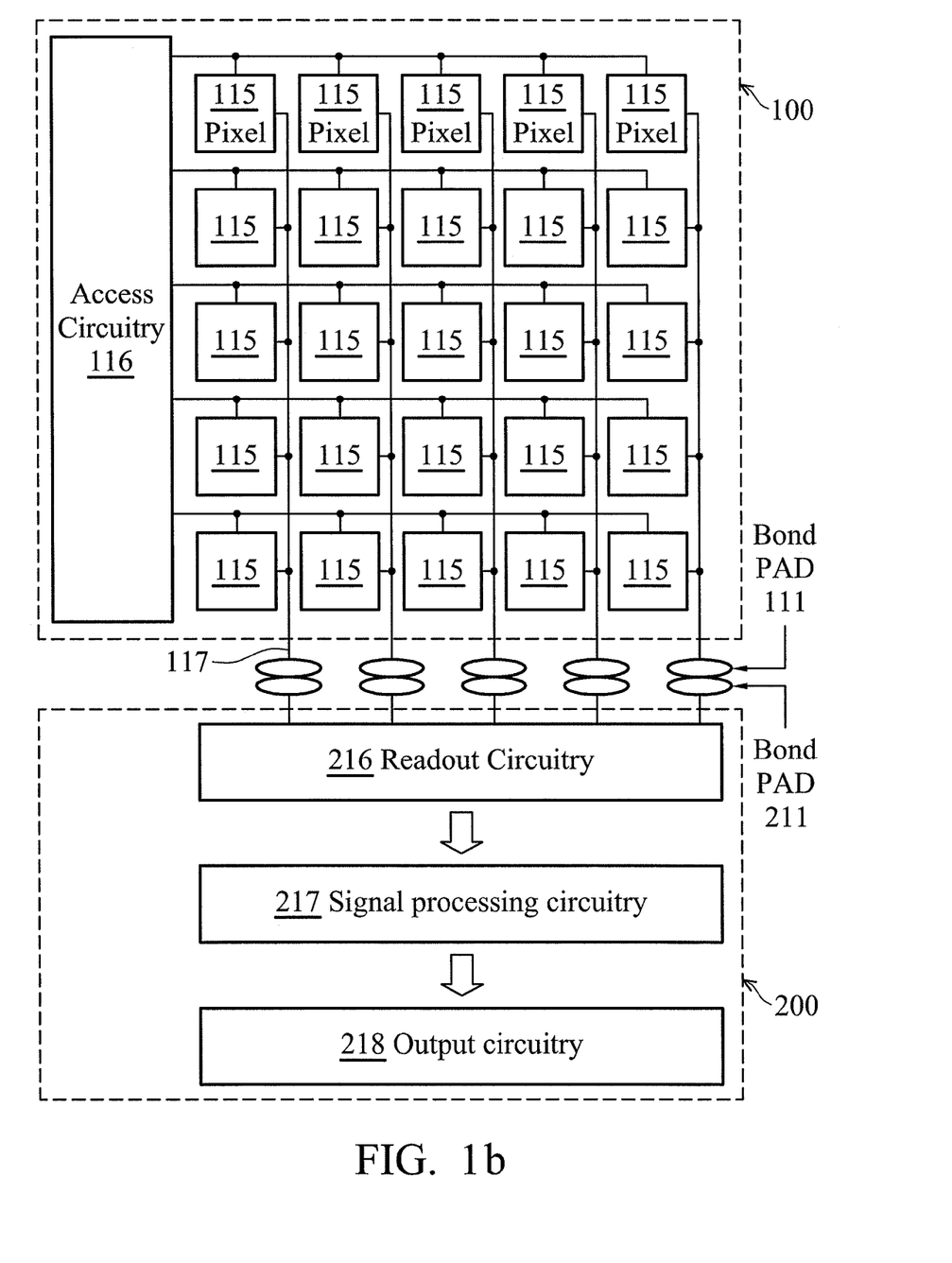
Figure 1C:
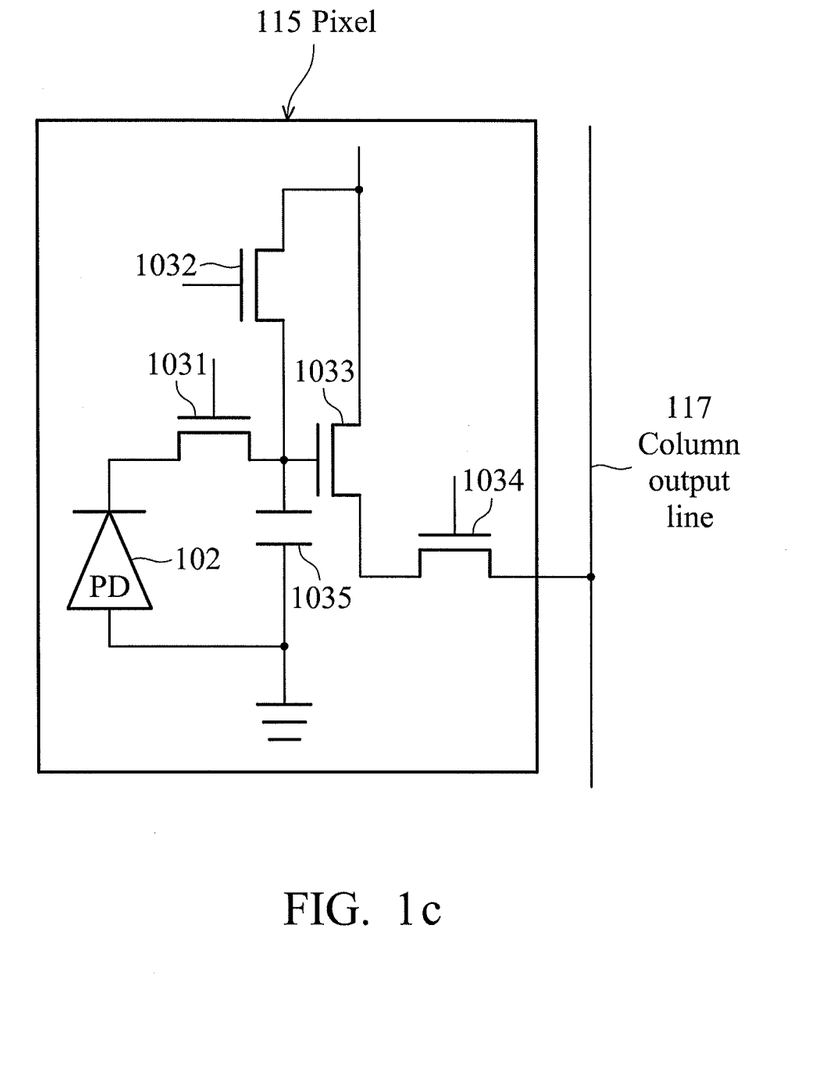

The sensor 100 may comprise a grid or array of pixels or sensor elements formed on the substrate 101. An exemplary grid is shown in FIG. 1(b), where a plurality of pixels 115 forms an array of size 5*5. A pixel 115 or a sensor element may comprise a photosensitive diode 102, or simply referred as a photodiode 102, connected to a transistor 103 as shown in FIG. 1(a) or to a plurality of transistors as shown in FIG. 1(c). The photodiode 102 may generate a signal related to the intensity or brightness of light that impinges on the photosensitive diode 102. The photosensitive diode 102 may be a pinned layer photodiode comprising a p-n-p junction. A non-pinned layer photodiode may alternatively be used. Any suitable photodiode may be utilized with the embodiments, and all of these photodiodes are intended to be included within the scope of the embodiments.

FIG. 1(a) illustrates that one photodiode 102 is connected to one transistor 103 forming a pixel. There may be a plurality of transistors connected to a photodiode 102, as shown in FIG. 1(c), where a pixel 115 comprises a photodiode 102, in addition to transistors such as 1031, 1032, 1033, and 1034, which may be a transfer transistor, a reset transistor, a source follower transistor, or a select transistor. The pixel 115 may comprise other devices such as capacitors 1035 as well, as shown in FIG. 1(c). The transistors 103 in FIG. 1(a) or the transistors 1031, 1032, 1033, and 1034 in FIG. 1(c) may comprise a gate dielectric, a gate electrode, source, drain, and spacers.

The substrate 101 may further comprise a plurality of isolation areas, not shown, to separate and isolate various devices formed on the substrate, and also to separate the pixels from other logic regions of a sensor.

As illustrated in FIG. 1(a), a plurality of conductive and dielectric layers may be formed on the front side of the substrate 101, which are collectively referred to as the inter-metal dielectric (IMD) layer 104, to connect various devices to each other. An inter-layer dielectric layer (ILD) may be formed on the front side of the substrate 101 below the IMD layer. The ILD and IMD layers may comprise a material such as boron phosphorous silicate glass (BPSG), although any suitable dielectrics may be used for either layer. The ILD and IMD layers may be formed of low-k dielectric materials with k values less than, for example, about 2.5.

A plurality of vias 113 and contacts 114 may be formed within the IMD layer 104. The contacts 111 formed on the top metal layer, commonly referred to Mtop, may be called bond pads, connected to photodiodes 102 and the transistors 103, or other function devices within the sensor 100. The dummy pads 112 are formed on the top metal layer, which are not connected to any function circuit of the sensor 100. Dummy pads 112 are used to increasing bonding between the ASIC 200 and the senor 100. They do not conduct any signals as the bond pads 111 do. These contacts and vias 111, 113, and 114, and dummy pads 112 may be made through any suitable formation process (e.g., lithography with etching, damascene, dual damascene, or the like) and may be formed using suitable conductive materials such as aluminum alloys, copper alloys, or the like.

On the backside of the substrate 101, a dielectric layer 106 may be formed. A micro-lens layer 109 and a color filter layer 108 may be formed on the dielectric layer 106 for color imaging applications. The micro-lens lenses 109 may be located above the color filter 108 and the backside of the substrate, such that the backside-illuminated light can be focused on the light-sensing regions. The micro-lens 109 converges light illuminated from the backside of the substrate to the photodiode. Associated with each of the color filter elements is a corresponding micro-lens. The color filter elements and associated micro-lenses may be aligned with the photosensitive elements of the sensor layer using alignment marks.

As illustrated in FIG. 1(a), a plurality of through-silicon-vias (TSV) 105 may be formed through the inter metal dielectric (IMD) layer 104 at the front side of the substrate 101, the substrate 101, and the dielectric layer 106 at the backside of the substrate 101, connecting contacts 114 at the front side to the contacts 107 at the backside of the substrate. There may be a plurality of such TSVs in the sensor 100.

Similarly, a cross-section view of an application specific integrated circuit (ASIC) 200 is shown in FIG. 1(a). The ASIC 200 may be referred to as an integrated circuit device, a circuit, a device, a circuit device, a die, or in any other terms known to those skilled in the art. The ASIC 200 may be related to the sensor 100 to process digital or analog signals generated by the sensor 100.

The ASIC 200 may be made up of millions of components such as active devices and passive devices. The side of the silicon substrate on which the integrated circuit is formed may be referred to as the top side or the front side of the ASIC 200. There is a plurality of transistors 203 shown in FIG. 1(a) formed on the substrate 201 of the ASIC 200. The number of transistors shown is only for illustration purposes and are not limiting. An inter-layer dielectric layer (ILD) may be formed on the front side of the substrate 201. The ILD layer may comprise a material such as boron phosphorous silicate glass (BPSG), although any suitable dielectrics may be used for either layer. Various conductive and dielectric layers may be formed on the ILD layer, which may be generally referred as the inter-metal dielectric (IMD) layer 204, to connect various devices to each other. These components are initially isolated from each other, formed on an underlying silicon substrate 201, and are later interconnected together by metal interconnect lines to form the functional circuit. Typical interconnect structures include lateral interconnections, such as metal lines or contacts 214, and vertical interconnections, such as vias 213. Contacts 211 are formed on the top metal layer of the ASIC, which are used to bond together with bond pads 111 of the sensor 100. Dummy pads 212 may be added to the ASIC as well, located on the top metal layer of ASIC 200.

FIG. 1(b) illustrates an exemplary function of the sensor 100 and the ASIC 200 bonded together through the connection of bond pads 111 of the sensor 100 and the bond pads 211 of the ASIC. The sensor 100 may comprise a grid or array of pixels or sensor elements 115 form an array of size 5*5. Each column of pixels 115 may share an interconnection or an inter metal line 117 connected to one bond pad 111 to transfer pixel outputs to the bond pad 111. Other circuits such as the access circuitry 116 may be formed on the sensor 100 as well. The sensor 100 generates a voltage signal in the pixel, which is further transformed into a digital signal to be processed by the ASIC 200. The ASIC 200 may comprise a readout circuitry component 216 to read the signals out from the pixel arrays 115. The readout signals will be processed by a signal processing circuitry component 217. The processed signals generate the output for the image sensor application, done by an output circuitry component 218.

Figure 2A:
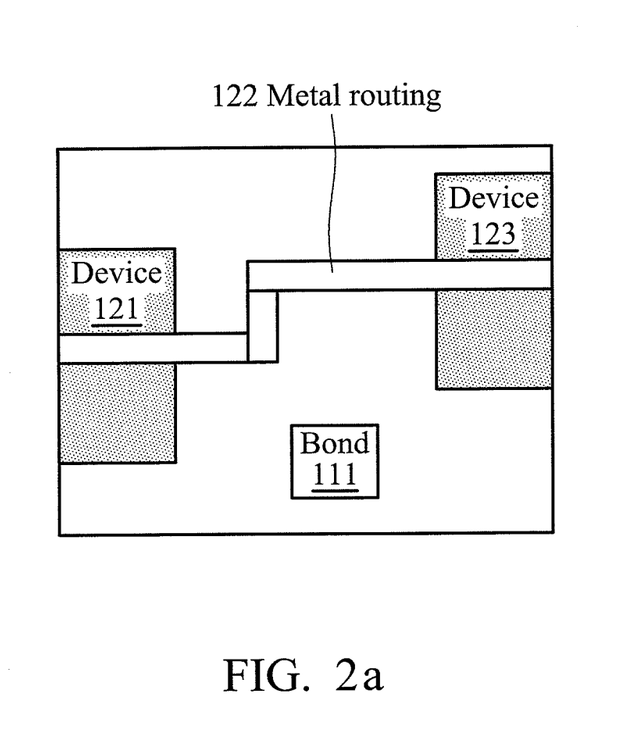
FIGS. 2(a)-2(b) illustrate the use of dummy pads in bonding a CMOS sensor and an ASIC.
Figure 2B:
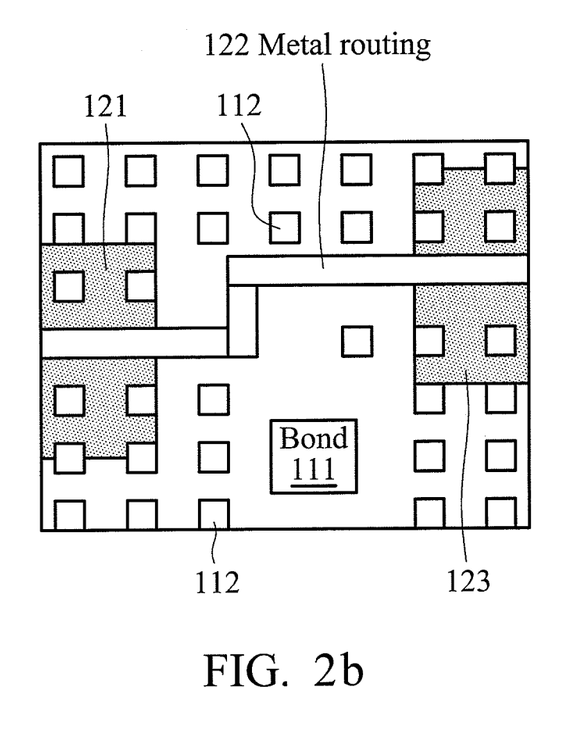

A plurality of dummy pads 112 is illustrated in FIG. 1(a) to increase the bonding strength between the sensor 100 and the ASIC 200. The dummy pads 112, which are not connected to any function circuit of the sensor 100, are formed on the top metal layer. The usage of dummy pads may be demonstrated in FIGS. 2(a) and 2(b). FIG. 2(a) illustrates the main metal components of a circuit such as the metal routings 122 between two component devices 121 and 123, in addition to the necessary bond pads 111. However, those metal components may not be enough to achieve high bonding strength. To achieve high bonding strength, it may be needed to have a metal density of about 40% of the overall chip area. Sometimes a foundry may have a different design rule on the metal density. Inserting a Cu dummy pattern is to lower chemical-mechanical polishing (CMP) global and local loading effect, and to achieve a flat, Cu residue-free, less Cu-dishing polishing surface. The more flat a surface is, the better bondability the surface has. The Cu dummy pattern density should be less than about 40%, which means that the oxidized area is larger than the Cu dummy pattern area. This is a trade-off between the dummy pattern insertion and the lower pattern density. Dummy pads can be added globally and uniformly to achieve foundry's dummy pad filling rules, such as size, area, local and whole-chip pattern density, to increase bonding successful rate between the ASIC 200 and the sensor 100. FIG. 2(b) illustrates the metal components of a circuit after adding the dummy bond pads 112. The dummy bond pad 112 shown in FIG. 2(b) may be the dummy bond pad 112 shown in FIG. 1(a).

Figure 3A:
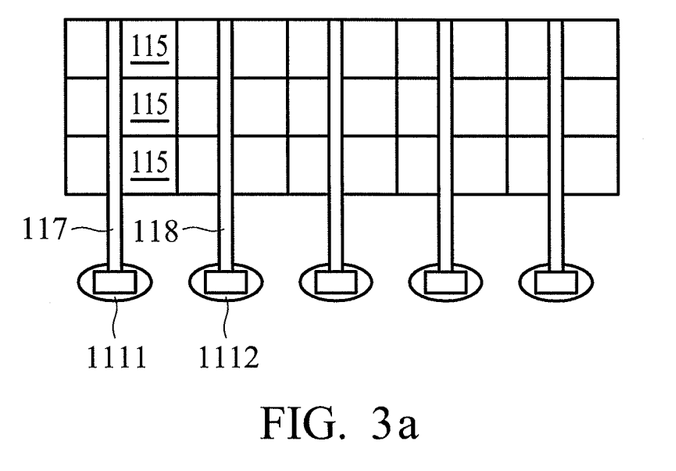
FIGS. 3(a)-3(c) illustrate exemplary configurations of bond pads for columns of pixels of a CMOS sensor.
Figure 3B:
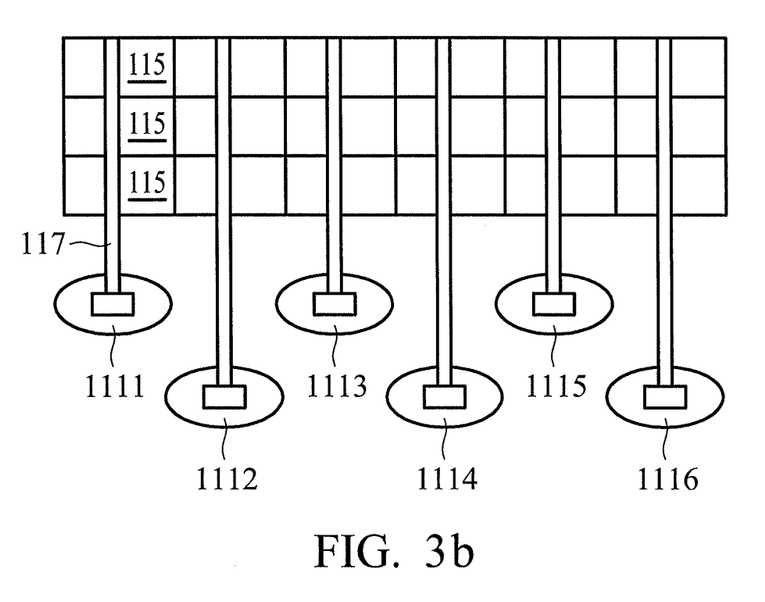
Figure 3C:
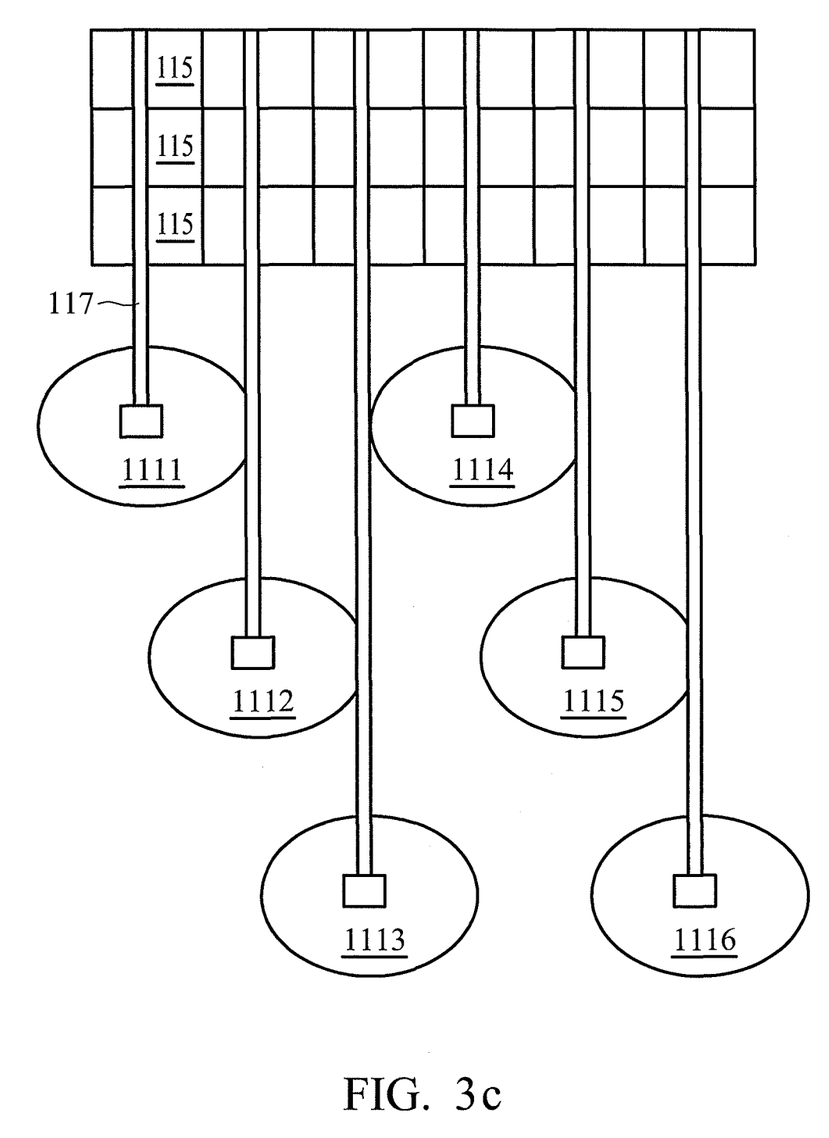

As illustrated in FIG. 1(b), a sensor comprises an array of pixels, and a column of pixels of the array may share an inter metal line connected to one shared bond pad 111. FIGS. 3(a)-3(c) show various configurations of how a column of pixels sharing a bond pad and how the bond pads for an array of pixels are configured on the top metal layer.

FIG. 3(a) illustrates a pixel array of 3*5, where 5 columns of pixels are formed, with 3 pixels in each column. Each pixel of the pixel array comprises a photodiode and a plurality of transistors as shown in FIG. 1(a) or FIG. 1(c) formed in the substrate of the sensor. Each pixel of the array may be of a substantially similar size. Each pixel may be a rectangle or a square, even though other shapes may be possible as well. Each column of pixels may share an inter metal line connecting the column of pixels to a bond pad. For example, the 3 pixels 115 of the first column in FIG. 3(a) share an inter metal line 117 connecting the pixels 115 to the first bond pad 1111. The bond pad 1111 may be located at a top metal layer at the front side of the substrate.

The pixel array in FIG. 3(a) may further comprise a second column of pixels next to the first column of pixels. The second column of pixels may have the same number of pixels as the first column has. The pixels in the second column may be adjacent to the pixels of the first column in one-to-one fashion, as shown in FIG. 3(a). The pixels in the second column are connected to a second bond pad 1112 located at the top metal layer at the front side of the substrate, by a second inter metal line 118. A distance between the first inter metal line 117 and the second inter metal line 118 may be about a width of one pixel.

As illustrated in FIG. 3(a), a size of the first bond pad and the second bond pad is about half of the width of one pixel. The bond pads may be other sizes less than the width of the pixel. When the bond pads are of about half of the width of one pixel, or other sizes less than the width of the pixel, the bond pads may be aligned in one row on the top metal layer, as shown in FIG. 3(a). There is no overlap between them, because the distance between two inter metal lines is about a width of the pixel, and the size of the bond pads is less than a width of the pixel.

However, the size of the bond pads may be larger than or equal to the width of the pixels, as illustrated in FIGS. 3(c) and 3(b). When a size of the first bond pad and the second bond pad is about a size larger than or equal to the width of one pixel, the first bond pad and the second bond pad may not be in a row since they may overlap if placed in a row; instead they should be located in a disjoint area of the top metal layer at the front side of the substrate.

FIG. 3(b) illustrates an array of 3*6, where 6 columns of pixels are formed, with 3 pixels in each column. Other number of pixels may be formed in a column, such as two pixels or more. Each pixel of the pixel array comprises a photodiode and a plurality of transistors as shown in FIG. 1(c) formed in the substrate of the sensor. Each pixel of the array may be of a substantially similar size. Each pixel may be a rectangle or a square, even though other shapes may be possible as well. A column of pixels 115 are connected by a same inter metal line 117 in the first column to a same bond pad 1111 for the first column of pixels. The second column of pixels is connected to the bond pad 1112, and so on as shown in FIG. 3(b). A distance between any two adjacent inter metal lines for two adjacent column of pixels is about a width of one pixel.

The size of the bond pad for a column of pixels may be of a size about a width of one pixel, as shown in FIG. 3(b). The bond pads are sequentially numbered by adjacency, starting from the first bond pad for the first column numbered as 1111, and the second pad numbered as 1112 for the second column of pixels, and so on, until the 6$^{th}$ bond pad numbered as 1116 for the 6$^{th}$ column of pixels. As illustrated in FIG. 3(b), the odd numbered bond pads 1111, 1113, and 1115 form a first row, and every even numbered bond pads 1112, 1114, and 1116 form a second row with a separation space from the first row. There may be other ways to number the pads. There may be other way to arrange the bond pads to be disjoint from each other. The formation of two rows of bond pads is just one way to form a regular pattern for the bond pads.

FIG. 3(c) illustrates an array of 3*6, where 6 columns of pixels are formed, with 3 pixels in each column, which is similar to the configuration of the pixel array and bond pads in FIG. 3(b). The only difference is that the bond pads in FIG. 3(c) have a size of about a width of two pixels. The bond pads are similarly numbered sequentially by adjacency. Starting from the first bond pad for the first column numbered as 1111, and the second pad numbered as 1112 for the second column of pixels, and so on, until the 6$^{th}$ bond pad numbered as 1116 for the 6$^{th}$ column of pixels. As illustrated in FIG. 3(c), the first bond pad 1111 and the bond pad with number 1111+3=1114 form a first row. The second bond pad 1112 and the bond pad with number 1112+3=1115 form a second row. The third bond pad 1113 and the bond pad with number 1113+3=1116 form a third row. In general, a first bond pad forms a first row with any bond pad numbered as 1+3*n, a second bond pad forms a second row with any bond pad numbered as 2+3*n, and a third bond pad forms a third row with any bond pad numbered as 3+3*n.

Figure 4A:
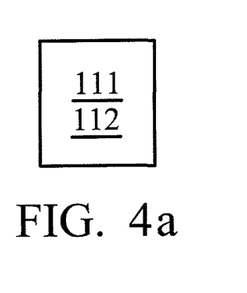
FIGS. 4(a)-4(c) illustrate various shapes of bond pads of a CMOS sensor.
Figure 4B:
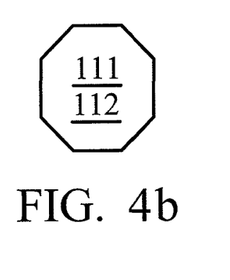
Figure 4C:
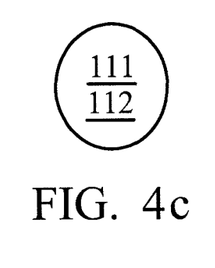

FIGS. 4(a)-4(c) illustrate various shapes of the bond pads or dummy pads, such as a square or rectangle shown in FIG. 4(a), a diamond shown in FIG. 4(b), or a circle shown in FIG. 4(c). For different shape of the pad, the size of the pad may be the longest distance between two points of the pad.

Figure 5A:
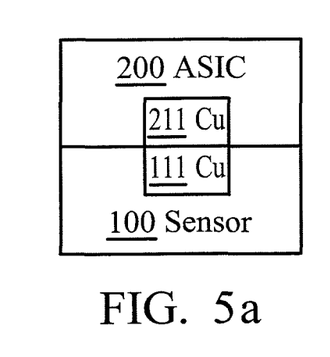
FIGS. 5(a)-5(c) illustrate the bonding of a CMOS sensor bond pad and a dummy pad with an ASIC bond pad and a dummy pad respectively.
Figure 5B:
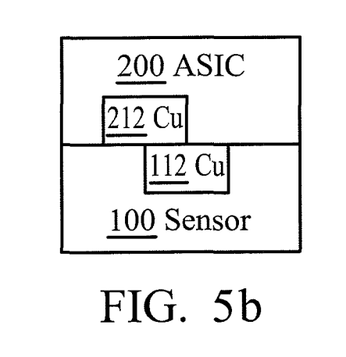
Figure 5C:
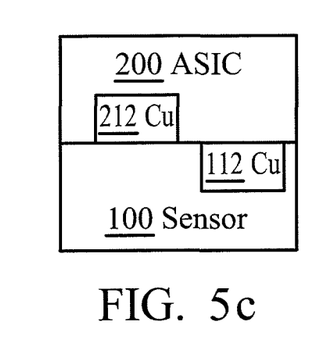

FIG. 5(a)-5(c) illustrates how a bond pad or a dummy pad of the senor is bonded to a bond pad or a dummy pad of the ASIC. A bond pad of the ASIC chip is bonded to a bond pad of the BSI sensor device of a same shape, and substantially aligned as shown in FIG. 5(a). On the other hands, a dummy pad of the sensor 100 and a dummy pad of the ASIC can be bonded together when the two dummy pads have certain overlap as shown in FIG. 5(b), or even when the two dummy pads have no overlap as shown in FIG. 5(c).

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A sensor device, comprising:
a substrate with a front side and a backside, the front side having a first surface area;
a first column of pixels comprising a first pixel and a second pixel within the substrate;
a first bond pad located at a top metal layer at the front side of the substrate connected to the first pixel and the second pixel by a first inter metal line, the first inter metal line extending in a first direction;
a second bond pad located at the top metal layer;
a plurality of dummy pads on the front side of the substrate, the plurality of dummy pads having a cumulative surface area of less than about 40% of the first surface area, at least one dummy pad being interjacent the first bond pad and the second bond pad; and a through via extending through the substrate and electrically connecting the second bond pad to a contact disposed on the backside of the substrate.

2. The sensor device of claim 1, further comprising:
a second column of pixels next to the first column of pixels comprising a third pixel and a fourth pixel within the substrate; and
a third bond pad located at the top metal layer at the front side of the substrate connected to the third pixel and the fourth pixel by a second inter metal line, wherein the first bond pad and third bond pad are aligned along a line perpendicular to the first direction and wherein the second bond pad is offset relative to the line perpendicular to the first direction.

3. The sensor device of claim 2, wherein a distance between the first inter metal line and the second inter metal line is about a width of one pixel.

4. The sensor device of claim 3, wherein a size of the first bond pad and the third bond pad is about half of the width of one pixel.

5. The sensor device of claim 3, wherein a size of the first bond pad and the third bond pad is about a size larger than or equal to the width of one pixel, and the first bond pad and the third bond pad are located in a disjoint area of the top metal layer at the front side of the substrate.

6. The sensor device of claim 1, further comprising a plurality of columns of pixels, wherein:
each column of pixels comprises at least two pixels;
each pixel of a column of pixels is connected by a same inter metal line to a same bond pad for the column of pixels located at the top metal layer at the front side of the substrate;
a distance between any two adjacent inter metal lines is about a width of one pixel;
a bond pad for a column of pixels is of a size about a width of one pixel and the bond pad is sequentially numbered by adjacency; and
every odd numbered bond pad forms a first row extending in a first direction, and every even numbered bond pad forms a second row extending in the first direction, the second row being laterally displaced from the first row in a second direction perpendicular to the first direction.

7. The sensor device of claim 1, further comprising a plurality of columns of pixels, wherein:
each column of pixels comprises at least two pixels;
each pixel of a column of pixels is connected by a same inter metal line to a same bond pad for the column of pixels located at the top metal layer at the front side of the substrate;
a distance between any two adjacent inter metal lines is about a width of one pixel;
a bond pad for a column of pixels is of a size about a width of two pixels and the bond pad is sequentially numbered by adjacency; and
a first bond pad forms a first row with any bond pad numbered as 1+3*n, a second bond pad forms a second row with any bond pad numbered as 2+3*n, and a third bond pad forms a third row with any bond pad numbered as 3+3*n, wherein the first, second, and third row are parallel to one another along a first direction and laterally displaced from one another along a second direction perpendicular to the first direction.

8. The sensor device of claim 1, wherein the through via extends from the front side to the backside of the substrate.

9. The sensor device of claim 1, wherein a pixel of the first column of pixels comprises a photodiode and a transistor.

10. The sensor device of claim 1, further comprising a micro-lens and a color filter on the backside of the substrate.

11. The sensor device of claim 1, further comprising:
an application specific integrated circuit (ASIC) chip with a plurality of bond pads, wherein each bond pad of the sensor device is bonded to a bond pad of the plurality of bond pads of the ASIC in a one-to-one aligned fashion.

12. The sensor device of claim 11, wherein a bond pad of the ASIC chip is bonded to a bond pad of the sensor device of a same shape.

13. The sensor device of claim 11, wherein the ASIC chip further comprising a dummy pad which is not aligned to a dummy pad of the sensor device.

14. An integrated circuit (IC) device, comprising:
a sensor device comprising:
a substrate with a front side and a backside;
a first column of pixels comprising a first pixel and a second pixel within the substrate;
a first bond pad located at a first top metal layer of a first intermetal dielectric (IMD) layer disposed at the front side of the substrate connected to the first pixel and the second pixel by a first inter metal line; and
a plurality of dummy pads in the first top metal layer of the first IMD, wherein a dummy pad is not connected to any functional circuit of the sensor device; and
an application specific integrated circuit (ASIC) chip comprising a plurality of bond pads disposed in a second top metal layer of a second IMD layer, wherein the first bond pad of the sensor device is bonded to a bond pad of the plurality of bond pads of the ASIC in a one-to-one aligned fashion;
wherein the first IMD layer directly contacts the second IMD layer; and
wherein the second IMD layer directly contacts a surface of one of the plurality of dummy pads, wherein the surface of the one of the plurality of dummy pads is substantially level with an interface between the sensor device and the ASIC chip.

15. The IC device of claim 14, further comprising:
a second column of pixels next to the first column of pixels comprising a third pixel and a fourth pixel within the substrate; and
a second bond pad located at the first top metal layer connected to the third pixel and the fourth pixel by a second inter metal line;
wherein the second bond pad is bonded to another bond pad of the ASIC chip.

16. The IC device of claim 15, wherein a distance between the first inter metal line and the second inter metal line is about a width of one pixel.

17. The IC device of claim 16, wherein a size of the first bond pad and the second bond pad is about a size larger than or equal to the width of one pixel, and the first bond pad and the second bond pad are located in a disjoint area of the first top metal layer at the front side of the substrate.

18. The IC device of claim 14, the plurality of dummy pads having a cumulative surface area of less than about 40% of a surface area of the substrate.

19. The IC device of claim 14, wherein at least one of the plurality of dummy pads does not directly contact any metal feature in the ASIC chip.

20. An integrated circuit (IC) device, comprising:
a sensor device comprising:
a substrate with a front side having a first surface area and a backside;
a first column of pixels comprising a first pixel and a second pixel within the substrate;
a first plurality of bond pads located at a first top metal layer at the front side of the substrate connected to the first pixel and the second pixel by a first inter metal line;
a first top dielectric layer; and a plurality of dummy pads located at the first top metal layer and electrically insulated from the first pixel and second pixel, the plurality of dummy pads having a cumulative surface area of less than about 40% of the first surface area; and a die comprising a second plurality of bond pads and a second top dielectric layer, wherein each bond pad of the second plurality of bond pads is bonded to a respective bond pad of the first plurality of bond pads of the die, and wherein the first top dielectric layer directly contacts the second top dielectric layer, and wherein the second top dielectric layer contacts the dummy pad.

21. The IC device of claim 20, further comprising:

a second bond pad located at the first top metal layer at the front side of the substrate; and a through via extending through the substrate and electrically connecting the second bond pad to a contact disposed on the backside of the substrate.

22. The IC device of claim 20, wherein a size of a first bond pad of the first plurality of bond pads is larger than or about equal to a width of one pixel; and wherein the first bond pad is located in a disjoint area of the first top metal layer.

23. The IC device of claim 20, wherein the first plurality of bond pads and the first top metal layer are disposed in a first intermetal dielectric (IMD) layer disposed at the front side of the substrate;

wherein the second plurality of bond pads of the die are disposed in a second top metal layer of a second IMD layer of the die; and wherein the first IMD layer is oxide bonded to second IMD layer.

* * * * *